(12) United States Patent
Vasoya et al.

(10) Patent No.: US 7,173,325 B2
(45) Date of Patent: Feb. 6, 2007

(54) EXPANSION CONSTRAINED DIE STACK

(75) Inventors: Kalu K. Vasoya, Huntington Beach, CA (US); Bharat M. Mangrolia, Huntington Beach, CA (US)

(73) Assignee: C-Core Technologies, Inc., Costa Mesa, CA (US)

( * ) Notice: Subject to any disclaimer, the term of this patent is extended or adjusted under 35 U.S.C. 154(b) by 0 days.

(21) Appl. No.: 10/930,397

(22) Filed: Aug. 30, 2004

(65) Prior Publication Data

US 2005/0056922 A1     Mar. 17, 2005

Related U.S. Application Data

(60) Provisional application No. 60/498,957, filed on Aug. 29, 2003.

(51) Int. Cl.
| H01L 23/02 | (2006.01) |
| H01L 23/48 | (2006.01) |
| H01L 23/34 | (2006.01) |
| H01L 23/06 | (2006.01) |
| H01L 23/52 | (2006.01) |

(52) U.S. Cl. .............. 257/686; 257/685; 257/688; 257/689; 257/723; 257/725; 257/729; 257/777; 257/778

(58) Field of Classification Search ........ 257/685–686, 257/688–689, 777–778, 723, 725, 729
See application file for complete search history.

(56) References Cited

U.S. PATENT DOCUMENTS

| 5,861,666 | A | * | 1/1999 | Bellaar | 257/686 |
| 5,872,025 | A | * | 2/1999 | Cronin et al. | 438/109 |
| 5,883,426 | A | * | 3/1999 | Tokuno et al. | 257/686 |
| 5,963,430 | A | * | 10/1999 | Londa | 361/790 |
| 6,054,337 | A |   | 4/2000 | Solberg | |
| 6,147,401 | A |   | 11/2000 | Solberg | |
| 6,214,640 | B1 |   | 4/2001 | Fosberry et al. | |
| 6,222,740 | B1 |   | 4/2001 | Bovensiepen et al. | |
| 6,225,688 | B1 |   | 5/2001 | Kim et al. | |
| 6,232,152 | B1 |   | 5/2001 | DiStefano et al. | |
| 6,313,528 | B1 |   | 11/2001 | Solberg | |
| 6,376,769 | B1 | * | 4/2002 | Chung | 174/524 |
| 6,504,241 | B1 | * | 1/2003 | Yanagida | 257/686 |
| 6,740,981 | B2 | * | 5/2004 | Hosomi | 257/778 |
| 6,768,208 | B2 | * | 7/2004 | Lin et al. | 257/777 |
| 6,770,980 | B2 | * | 8/2004 | Shibata | 257/777 |
| 6,777,798 | B2 | * | 8/2004 | Fukumoto et al. | 257/686 |
| 6,869,665 | B2 |   | 3/2005 | Tani et al. | |
| 6,992,395 | B2 | * | 1/2006 | Fukasawa | 257/777 |
| 6,998,704 | B2 | * | 2/2006 | Yamazaki et al. | 257/688 |
| 7,002,080 | B2 |   | 2/2006 | Tani et al. | |
| 7,053,478 | B2 | * | 5/2006 | Roper et al. | 257/686 |
| 2002/0074637 | A1 | * | 6/2002 | McFarland | 257/686 |
| 2002/0121687 | A1 | * | 9/2002 | Winderl | 257/686 |
| 2004/0178488 | A1 | * | 9/2004 | Bolken et al. | 257/686 |
| 2004/0178495 | A1 | * | 9/2004 | Yean et al. | 257/723 |
| 2005/0006787 | A1 | * | 1/2005 | Chiu | 257/777 |

\* cited by examiner

*Primary Examiner*—Ida M. Soward
(74) *Attorney, Agent, or Firm*—Christie, Parker & Hale, LLP

(57) ABSTRACT

Structures and techniques for mounting semiconductor dies are disclosed. In one embodiment, the invention includes a stack of printed wiring board assemblies that are connected via interconnection components. At least one of the printed wiring board assemblies includes an interposer substrate having a constraining layer that includes carbon.

36 Claims, 18 Drawing Sheets

50

```
┌─────────────────────┐
│ Manufacture an      │──── 52
│ interposer substrate│
└─────────┬───────────┘
          ▼
┌─────────────────────┐
│ Apply RDL on to a   │──── 54
│ semiconductor (die) │
│ wafer               │
└─────────┬───────────┘
          ▼
┌─────────────────────┐
│ Bump the die        │──── 56
└─────────┬───────────┘
          ▼
┌─────────────────────┐
│ Cut die             │──── 58
└─────────┬───────────┘
          ▼
┌─────────────────────┐
│ Assemble bumped die on│── 60
│ to constrained interposer│
│ substrate.          │
└─────────────────────┘
```

Fig. 4

EXPANSION CONSTRAINED DIE STACK

CROSS-REFERENCE TO RELATED APPLICATIONS

This application claims priority to U.S. Provisional Application No. 60/498,957, filed Aug. 29, 2003, the disclosure of which is incorporated herein by reference.

BACKGROUND

The following invention relates generally to mounting components on printed wiring boards and more specifically to using die stacks to mount components on printed wiring boards.

Printed wiring boards are often used to establish electrical connections between various electronic devices. Printed wiring boards can be rigid or flexible and include a single functional layer or multiple functional layers. The length of the circuit trace connecting the electrical devices can impact on the operation of the devices. A longer track can introduce additional inductance and can also result in additional interference. Reducing the length of the path that signals must travel between components can decrease inductance and signal interference.

One approach to reducing the length of the signal path between components is to mount components as a Thin Small Outline Package (TSOP) stack. A TSOP stack is created by mounting TSOP components upon each other. TSOP stacking has been used in a variety of products, including high density memory modules, and is typically used with applications having switching speeds that are less than 333 MHz.

Another approach is to use Ball Grid Array stacking or BGA stacking. BGA stacking involves the use of multiple BGA components, which are stacked on top of each other. BGA in applications involving switching speeds that are less than 800 MHz.

SUMMARY OF THE INVENTION

Die stacking is a technique for mounting components on a printed wiring board that can enable an increased density of components. Increasing the density of components can enable higher speed by reducing the length of circuit traces between components, which decreases the amount of inductance and interference. Die stacking allows for various packaging types such as Multi Chip Modules (MCMs) and Chip Scale Packages (CSPs).

Embodiments of the invention enable semiconductor dies to be mounted in stacks. One embodiment of the invention includes a stack of printed wiring board assemblies that are connected via interconnection components. Where at least one of the printed wiring board assemblies includes an interposer substrate having a constraining layer that includes carbon.

In a further embodiment, the interposer substrate has a stiffness of more than 3 msi.

In another embodiment, at least one of the printed wiring board assemblies includes at least one semiconductor die attached to the interposer substrate and the semiconductor die is attached to the interposer substrate via a redistribution layer and interconnection components. Alternatively, the semiconductor die is attached to the interposer substrate via interconnection components. In addition, multiple semiconductor dies are located on one side of an interposer substrate. Also, multiple semiconductor dies are located on both sides of an interposer substrate.

A still further embodiment of the invention also includes at least one interposer substrate located between the printed wiring board assemblies in the die stack. Where adjacent printed wiring board assemblies are connected to the interposer substrate via interconnection components.

Yet another embodiment of the invention, includes a semiconductor die, an electrical connection layer and an interposer substrate. The interposer substrate includes a layer constructed using a carbon material.

In a still further embodiment again, the semiconductor die is an integrated electronic device and the electrical connection layer includes a redistribution layer and interconnection components. In addition, the redistribution layer is constructed from at least one layer of dielectric film and a thin film solderable layer and the interposer substrate includes a printed wiring board and interconnection components 24.

In yet another embodiment again, the printed wiring board includes at least one electrical layer and at least one constraining layer and the constraining layer includes chemical vapor deposition (CVD) diamond manufactured. Alternatively, the constraining layer includes diamond like carbon.

In yet another further embodiment, the constraining layer is constructed using a material having a thermal conductivity greater than 15 W/m.K, tensile modulus greater than 20 msi, electrical resistance greater than $10^9$ ohms, a dielectric constant less than 6.0 at 1 MHz and a coefficient of thermal expansion less than 4 ppm/° C. Alternatively, the constraining layer is constructed from a material having a thermal conductivity greater than 100 W/m.K, tensile modulus greater than 50 msi, electrical resistance greater than $10^{10}$ ohms, a dielectric constant less than 5.5 at 1 MHz and a coefficient of thermal expansion less than 3 ppm/° C. In another aspect, the constraining layer is constructed using a material having a thermal conductivity greater than 500 W/m.K, a tensile modulus greater than 90 msi, an electrical resistance greater than $10^{11}$ ohms, a dielectric constant less than 5.0 at 1 MHz and a coefficient of thermal expansion less than 2 ppm/° C.

In still yet another further embodiment, the interposer substrate has a coefficient of thermal expansion between −2 ppm/° C. to 12 ppm/° C. In another aspect, the interposer substrate has a coefficient of thermal expansion of −1 ppm/° C. to 9 ppm/° C. In yet another aspect, the interposer substrate has a coefficient of thermal expansion of between 1 ppm/° C. to 6 ppm/° C.

In still another further embodiment again, the printed wiring board includes at least one electrical layer, at least one dielectric layer and at least one constraining layer. In addition, the constraining layer is an electrically conductive material. Furthermore, the dielectric layers are interposed between the electrical layers, the dielectric layers are interposed between the constraining layers and the dielectric layers are interposed between the electrical layers and the constraining layers. Additionally, the constraining layer forms a functional layer within the printed wiring board.

In one implementation of the invention, the constraining layer is made from a composite of carbon fiber reinforced with resin. Additionally, the resin used to impregnate the carbon fiber is an epoxy. Alternatively, the resin used to impregnate the carbon fiber is Cynate ester, polyimide or Bismaleimide Triazine epoxy.

In another implementation of the invention, the constraining layer includes resin impregnated Uni tape. Alternatively, the constraining layer includes resin impregnated compression molded chopped carbon fiber.

In still yet another further embodiment again, the constraining composite layer has a thickness greater than 0.002 inches, in-plane thermal conductivity greater than 1.5 W/m.K, tensile modulus greater than 10 msi, a dielectric constant greater than 6.0 and a coefficient of thermal expansion that is less than 4 ppm/° C. and an electrical resistivity of less than 13 µΩ.m. Additionally, the constraining layer has a thickness greater than 0.003 inches, in-plane thermal conductivity greater than 20 W/m.k, tensile modulus greater than 15 msi, a dielectric constant greater than 8.0 and a coefficient of thermal expansion that is less than 3 ppm/° C., and an electrical resistivity of less than 10 µΩ.m. Indeed, the constraining layer has a thickness between 0.004 inches and 0.020 inches, an in-plane thermal conductivity greater than 40 W/m.K, a tensile modulus greater than 25 msi, a dielectric constant greater than 12.0, a coefficient of thermal expansion that is less than 2 ppm/° C., and the carbon or graphite that is used in the construction of the constraining layer has an electrical resistivity between 8.5 µΩ.m to 1.1 µΩ.m.

In a further additional embodiment, the printed wiring board includes at least one electrical layer, at least one dielectric layer and at least one constraining layer that is plated on at least one side with a layer of metal.

Another additional embodiment, further includes additional semiconductor dies connected to the intermediate substrate via electrical connection layers. In some instances, at least two semiconductor dies are connected to the same side of the intermediate substrate via electrical connection layers. In other instances, at least two semiconductor dies are connected to the opposite sides of the intermediate substrate via electrical connection layers. A further additional embodiment again includes a stack of printed wiring board assemblies connected via interconnection components and a printed wiring board connected to the stack of printed wiring board assemblies via interconnection components.

Where at least one of the printed wiring board assembly includes an interposer substrate having a constraining layer that includes carbon.

BRIEF DESCRIPTION OF THE DRAWINGS

FIG. 4 is a flow chart illustrating a process for manufacturing a printed wiring board in accordance with one embodiment of the present invention;

DETAILED DESCRIPTION OF THE INVENTION

Turning now to the drawings, printed wiring board assemblies are shown that can be used to create die stacks. In one embodiment, the printed wiring board assemblies include semiconductor dies that are attached to an interposer substrate using components that can be conceptualized as an electrical connection layer. The printed wiring board assemblies can be configured with single or multiple semiconductor dies attached to one or both sides of the interposer substrate in any variety of configurations. The printed wiring board assemblies in accordance with the present invention can be layered to form die stacks. In several embodiments, intermediate substrates are used to facilitate the creation of die stacks. In another aspect of the invention, one or more die stacks in various die stack configurations can be mounted on a printed wiring board to create a die stack assembly. The use of interconnection components to connect adjacent layers in the die stack can enable the communication of electrical signals between semiconductor dies in the die stack and between the semiconductor dies in the die stack and external devices.

Figure 1:
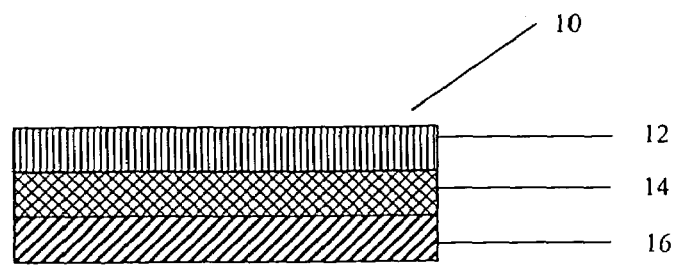
FIG. 1 is a block diagram illustrating one embodiment of a printed wiring board assembly in accordance with the present invention.

A printed wiring board assembly in accordance with the present invention is shown in FIG. 1. The printed wiring board assembly 10 includes a semiconductor die 12, an electrical connection layer 14 and an interposer substrate 16. In one embodiment the semiconductor die 12 is a semiconductor device and the electrical connection layer serves to both mount the semiconductor device onto the interposer substrate and create electrical connections between the semiconductor device and the interposer substrate. In several embodiments, the interposer layer is a stiff and thermally constrained printed wiring board with a low coefficient of thermal expansion.

Figure 2:
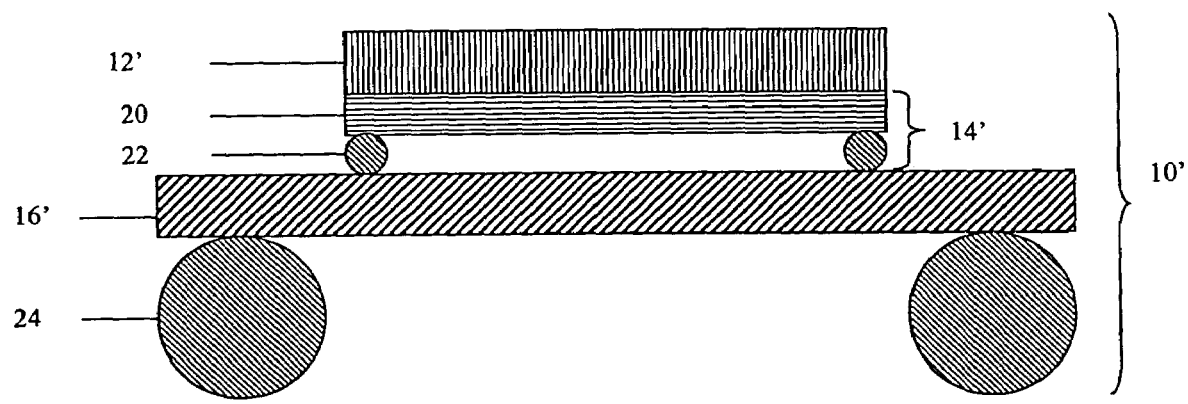
FIG. 2 is a schematic cross-sectional view of a printed wiring board in accordance with an embodiment of the present invention.

An embodiment of a printed wiring board assembly in accordance with the present invention is illustrated in FIG. 2. The printed wiring board assembly 10' includes, a semiconductor die 12' that is mounted onto an interposer substrate 16' via an electrical connection layer 14'. In the illustrated embodiment, the semiconductor die is an integrated electronic device. The electrical connection layer includes a redistribution layer 20 and interconnection components 22 and the interposer substrate includes a printed wiring board, which includes interconnection components 24.

The redistribution layer 20 and interconnection components 22 perform functions that include mounting the semiconductor die to the interposer substrate and creating electrical connections between the semiconductor die and the interposer substrate. The redistribution layer 20 is typically made of one or two layers of dielectric film and a thin film solderable layer of Al/NiV/Cu. manufactured by Kulicke & Soffa from Willow Grove, Pa. The interconnection components create electrical connections between the redistribution layer and the interposer substrate. In other embodiments, the redistribution layer can be constructed using any printed wiring board materials to which a semiconductor die can be directly attached and on which electrically conductive paths can be defined.

In one embodiment, the interconnection components are bumped solder balls. In other embodiments, solder columns or other interconnection components can be used to create electrical connections between the redistribution layer and the interposer substrate.

As discussed above, the interposer substrate can be implemented using a stiff, thermally constrained printed wiring board with a low coefficient of thermal expansion. In one embodiment, the interposer substrate has a stiffness of more than 3 msi and a coefficient of thermal expansion that is between 0 ppm/° C. and 12 ppm/° C. Preferably, the interposer substrate has a stiffness greater than 10 msi and a coefficient of thermal expansion that is between 1 ppm/° C. and 8 ppm/° C. More preferably, the interposer substrate has a stiffness greater than 25 msi and a coefficient of thermal expansion that is between 2 ppm/° C. and 4 ppm/° C.

Figure 3A:
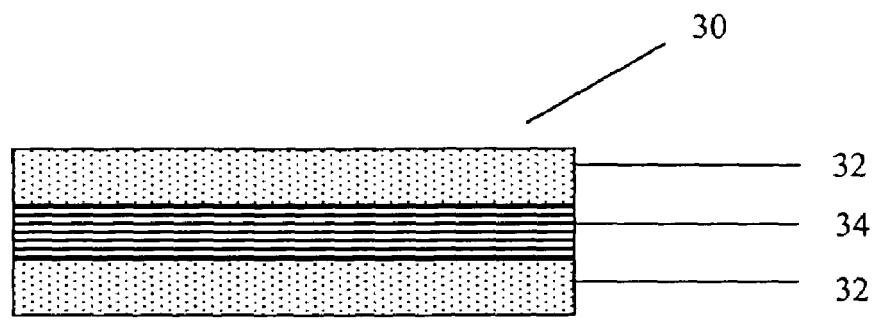
FIGS. 3A–3C are schematic cross-sectional views of printed wiring boards that can be used to implement interposer substrates in printed wiring board assemblies in accordance with the present invention.

An embodiment of a printed wiring board in accordance with the present invention that can be used as an interposer substrate is illustrated in FIG. 3A. The printed wiring board 30 includes at least one electrical layer 32 and at least one constraining layer 34. In the illustrated embodiment, the constraining layer 34 is a dielectric material that can prevent short circuits from occurring between the electrical layers. In one embodiment, the constraining layer includes chemical vapor deposition (CVD) diamond manufactured by Diamonex Company of Allentown, Pa. In other embodiments, the constraining layer can include diamond like carbon (DLC) manufactured by Diamonex Company of Allentown, Pa.

In other embodiments, the constraining layer can be constructed using a material having a thermal conductivity greater than 15 W/m.K, tensile modulus greater than 20 msi, electrical resistance greater than $10^9$ ohms, a dielectric constant less than 6.0 at 1 MHz and a coefficient of thermal expansion less than 4 ppm/° C. Preferably, the constraining layer is constructed from a material having a thermal conductivity greater than 100 W/m.K, tensile modulus greater than 50 msi, electrical resistance greater than $10^{10}$ ohms, a dielectric constant less than 5.5 at 1 MHz and a coefficient of thermal expansion less than 3 ppm/° C. More preferably, the constraining layer is constructed using a material having a thermal conductivity greater than 500 W/m.K, a tensile modulus greater than 90 msi, an electrical resistance greater than $10^{11}$, ohms, a dielectric constant less than 5.0 at 1 MHz and a coefficient of thermal expansion less than 2 ppm/° C. Irrespective of the material used in the construction of the constraining layer, the thickness of the material should be sufficient to prevent undesired short circuits between electrical layers. In one embodiment of the present invention, the volume ratio of the constraining layer to the rest of the layers provides overall in-plane surface expansion of interposer substrate between −2 ppm/° C. to 12 ppm/° C. Preferably, the volume ratio of the constraining layer to the rest of the layers provides overall in-plane surface expansion of interposer substrate between −1 ppm/° C. to 9 ppm/° C. More preferably, the volume ratio of the constraining layer to the rest of the layers provides overall in-plane surface expansion of interposer substrate between 1 ppm/° C. to 6 ppm/° C.

Figure 3B:
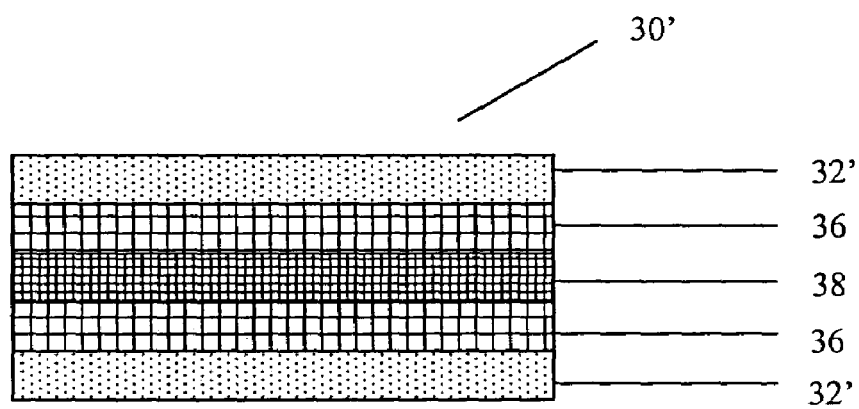

Another embodiment of a printed wiring board in accordance with the present invention that can be used as an interposer substrate is illustrated in FIG. 3B. The printed wiring board 30' includes at least one electrical layer 32', at least one dielectric layer 36 and at least one constraining layer 38. In the illustrated embodiment, the constraining layer is an electrically conductive material. Therefore, dielectric layers are interposed between the electrical layers, between the constraining layers and between the electrical layers and the constraining layers. In this configuration, the dielectric layers can serve to prevent short circuits between the conductive layers of the printed wiring board.

In one embodiment, the electrically conductive constraining layer does not form a functional layer within the printed wiring board (i.e. does not form one of the circuits implemented using the printed wiring board). In other embodiments, the electrically conductive constraining layer can form a functional layer. The constraining layer can serve to increase the stiffness of the printed wiring board, which can make the interposer substrate more rigid and reduce deflection when mounting semiconductor dies on the interposer substrate. The constraining layer can also increase the thermal conductivity of the printed wiring board and limit the thermal expansion of the printed wiring board. Preferably, the constraining layer serves to match the coefficient of thermal expansion of the interposer substrate to the coefficient of thermal expansion of the semiconductor die.

In one embodiment, the constraining layer is made from a composite of carbon fiber reinforced with resin. The carbon fiber substrate can be constructed using PAN based or PITCH based carbon or graphite fibers such as CN-80 manufactured by Nippon Graphite Fiber of Japan, K1352U manufactured by Mitsubishi Chemical Inc. of Japan, EWC-300X manufactured by Cytec carbon fibers LLC of Greenville, S.C. The carbon or graphite fibers can be woven prior to resin impregnation. The resin system used to impregnate the carbon substrate can be an epoxy or a polymer such as Cynate ester or polyimide.

In other embodiments, other electrically conductive materials can be used such as fibrous material impregnated with resin. The fibrous material can be any electrically conductive fiber and/or the resin can be electrically conductive. The fabric Style can be plain weave, twill weave leno weave, satin weave, basket weave, harness weave. Fibrous material can be made using continuous fibers, can be chopped or can be flakes. Resin can be Epoxy, Bismaleimide Triazine epoxy, Cynate Ester, Polyimide. Resin can have filler to improve properties.

In other embodiments, the constraining layer can include resin impregnated Uni tape, woven or compression molded chopped carbon fiber. In other embodiments the constraining composite layer has a thickness greater than 0.002 inches, in-plane thermal conductivity greater than 1.5 W/m.K, tensile modulus greater than 10 msi, a dielectric constant greater than 6.0 and a coefficient of thermal expansion that is less than 4 ppm/° C. and the electrical resistivity of the carbon or graphite that is used is less than 13 µΩ.m. Preferably, the constrained composite layer has a thickness greater than 0.003 inches, in-plane thermal conductivity greater than 20 W/m.k, tensile modulus greater than 15 msi, a dielectric constant greater than 8.0 and a coefficient of thermal expansion that is less than 3 ppm/° C., and the carbon or graphite used in the construction of the substrate has an electrical resistivity of less than 10 µΩ.m. More preferably, the constraining layer has a thickness between 0.004 inches and 0.020 inches, an in-plane thermal conductivity greater than 40 W/m.K, a tensile modulus greater than 25 msi, a dielectric constant greater than 12.0, a coefficient of thermal expansion that is less than 2 ppm/° C., and the carbon or graphite that is used in the construction of the constraining layer has an electrical resistivity between 8.5 µΩ.m to 1.1 µΩ.m.

In one embodiment, the volume ratio of the constraining layer to the rest of the layers provides overall in-plane surface expansion of the interposer substrate 30' of between −2 ppm/° C. to 12 ppm/° C. Preferably, the volume ratio of the constraining layer to the rest of the layers provides overall in-plane surface expansion of interposer substrate between −1 ppm/° C. to 9 ppm/° C. More preferably, the volume ratio of the constraining layer to the rest of the layers provides overall in-plane surface expansion of interposer substrate between 1 ppm/° C. to 6 ppm/° C.

Figure 3C:
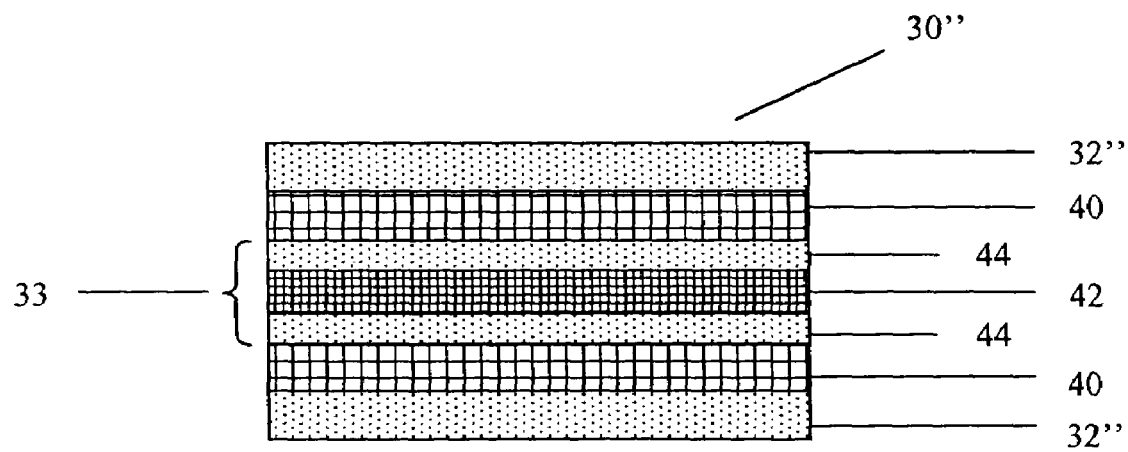

Another embodiment of a printed wiring board in accordance with the present invention that can be used to implement an interposer substrate is shown in FIG. 3C. The printed wiring board 30" includes at least one electrical layer 32", at least one dielectric layer 40 and at least one constraining layer 42 that is plated on at least one side with a layer of metal 44. The printed wiring board is similar to the printed wiring board 30' illustrated in FIG. 3B with the exception that of the metal plating of the constraining layer. In the illustrated embodiment, the constraining layer 42 is used as a functional layer of the printed wiring board. However, in other embodiments the constraining layer does not serve as a functional layer in the printed wiring board.

The constraining layer 42 on which the layers of electrically conductive metal are plated can be constructed from materials similar to those described above. An electrically conductive metal layer 44 of any thickness can be used in the construction of layers of metal used to plate the surfaces of the constraining layer, provided that the overall electrical conductivity of the constraining layer is sufficient to carry an electrical load. Electrical connections can occur between the electrically conductive metal layers 44 and the constraining layer either by direct surface contact or by plated through holes passing through the thickness of the constraining layer. In various embodiments, the constraining layer 42 can be used as a power plane or a ground plane or a combination of both.

The dielectric layers 40 typically prevent undesired electrical connections between adjacent functional layers. One method of intentionally creating electrical contacts between functional layers is to use plated vias or through holes. An electrical connection between a plated through hole and the constraining layer can be prevented by creating a clearance hole by oversize drilling, punching or routing and then refilling the clearance hole with dielectric material having a dielectric constant less than 5.0 before drilling and plating the through hole. By drilling the through hole to pass through the material in the clearance hole, the plating of the through hole is separated from the electrically conductive materials used to construct the constraining layer by an annulus of electrically insulating material. In one embodiment of the present invention, the volume ratio of the constraining layer 42 to the other layers must provide overall in-plane surface expansion of the printed wiring board 30" of between −2 ppm/° C. to 12 ppm/° C. Preferably, the volume ratio of the constraining layer 42 to the rest of the layers provides overall in-plane surface expansion of interposer substrate between −1 ppm/° C. to 9 ppm/° C. More preferably, the volume ratio of the constraining layer 42 to the rest of the layers provides overall in-plane surface expansion of interposer substrate between 1 ppm/° C. to 6 ppm/° C.

A process for constructing the printed wiring board shown in FIG. 2 is illustrated in FIG. 4. The process 50 includes manufacturing (52) an interposer substrate, applying redistribution layer (54) made of one or two layers of dielectric film and a thin solderable film of Al/NiV/Cu onto a semiconductor wafer (i.e. a semiconductor die), bumping the die (56), cutting (58) the die and assembling (60) the bumped die onto the interposer substrate.

In one embodiment, the manufacturing of the printed wiring board can be performed in accordance with the processes described in U.S. patent application Ser. No. 10/020,506, the disclosure of which is incorporated herein by reference in its entirety. In other embodiments, other techniques for manufacturing rigid printed wiring boards having low coefficients of thermal expansion can be used.

In one embodiment, the application of RDL onto the semiconductor wafer is to redistribute I/O pads from the perimeter footprint to an area array.

In one embodiment, the bumping of the die is performed to provide further electrical connection between die and interposer substrate. Once the bumping is complete, the cutting of the die can be performed.

In one embodiment, the assembly of the bumped die onto the interposer substrate can involve, screening solder paste onto the interposer substrate, mounting the bumped die onto the paste and wave soldering the assembly.

Figure 5A:
FIGS. 5A–5D are schematic cross-sectional views of components used in the construction of a printed wiring board assembly in accordance with an embodiment of the present invention at various stages in the construction of a printed wiring board assembly.
Figure 5B:
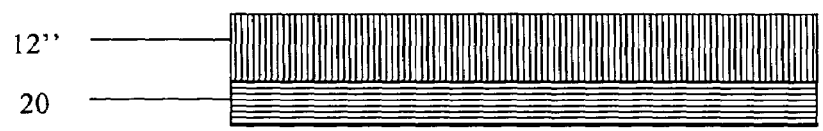
Figure 5C:
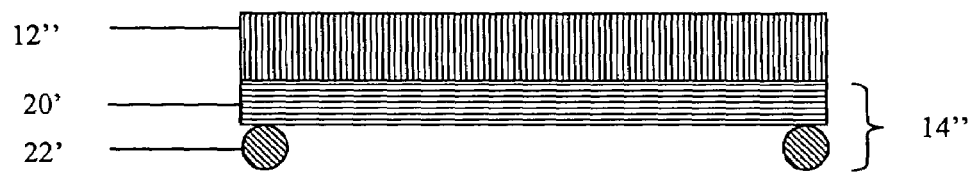
Figure 5D:
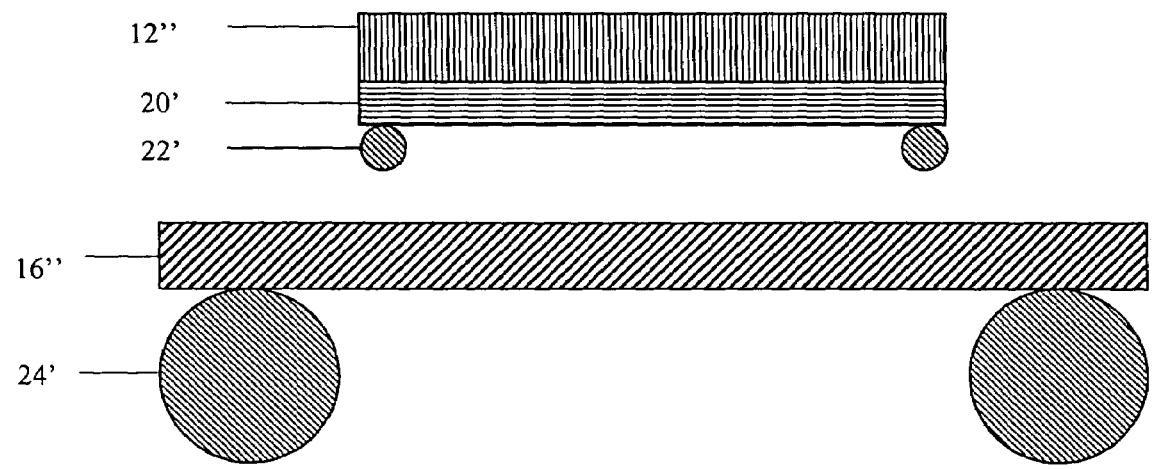

Components of a printed wiring board assembly during various stages in the construction of the assembly in accordance with the present invention are illustrated in FIGS. 5A–5D. A semiconductor die 12" is illustrated in FIG. 5A. A semiconductor die 12" that is attached to at least one redistribution layer 20' is illustrated in FIG. 5B. The redistribution layer is attached to the semiconductor die in the manner described above. A semiconductor die with a redistribution layer that includes interconnection components 22' is illustrated in FIG. 5C. The interconnection components are attached in the manner described above and complete the electrical connection layer 14". A semiconductor die and electrical connection layer assembly are illustrated prior to attachment to an interposer substrate 16" is illustrated in FIG. 5D. The interposer substrate also includes interconnection components 24' to create electrical connections with other devices. The components illustrated in FIG. 5D can be used to complete an embodiment of a printed wiring board assembly in accordance with the present invention using the techniques described above.

Figure 6:
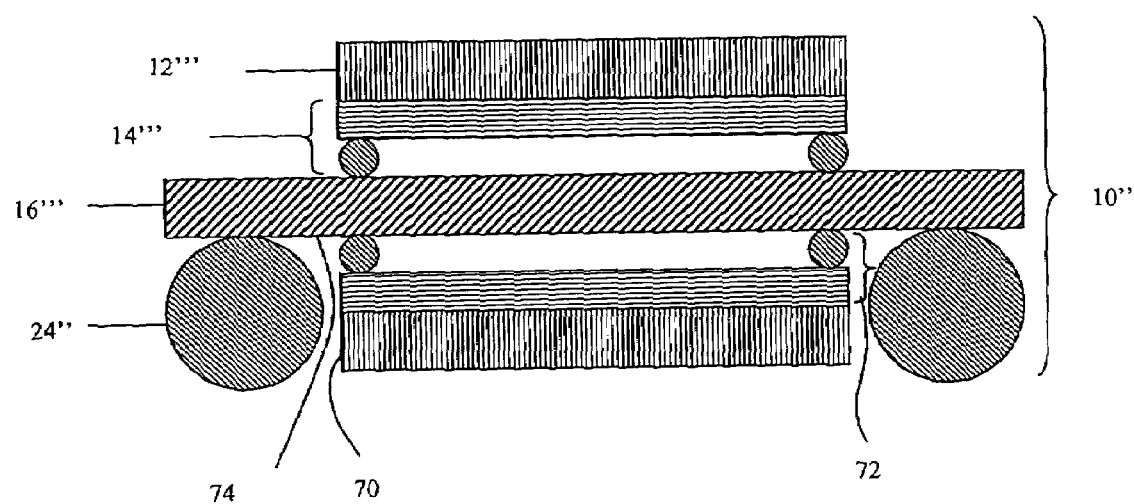
FIG. 6 is a schematic cross-sectional view of a printed wiring board assembly in accordance with an embodiment of the present invention that includes an interposer substrate with semiconductor dies attached to two of its surfaces.

Semiconductor dies can be attached to both sides of an interposer substrate. A printed wiring board assembly in accordance with the present invention that includes semiconductor dies attached to two sides of an interposer substrate is illustrated in FIG. 6. The printed wiring board assembly 10" illustrated in FIG. 6 is similar to that illustrated in FIG. 2 with the exception that a second semiconductor die 70 is attached to the interposer substrate via an electrical connection layer 72. In the illustrated embodiment, the electrical connection layers and the interposer substrate enable signals to be exchanged between the semiconductor devices. In addition, the electrical connection layers, the interposer substrate and the interconnection components 24" on the interposer substrate can enable the semiconductor dies to exchange signals with devices that are not mounted on the interposer substrate.

Figure 7:
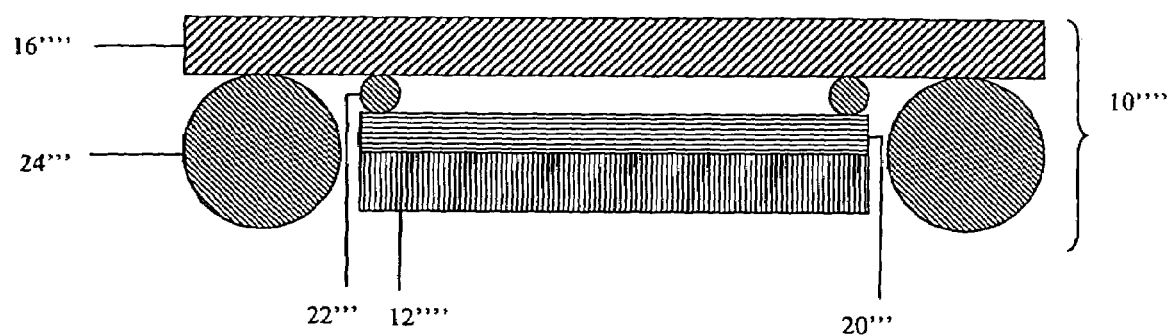
FIG. 7 is a schematic cross sectional view of a printed wiring board assembly in accordance with the present invention that includes an interposer substrate with a semiconductor die and interconnection components mounted on the same surface.

A printed wiring board assembly similar to the printed wiring board assembly 10' illustrated in FIG. 2 is shown in FIG. 7. The printed wiring board assembly 10''' shown in FIG. 7 is similar to that shown in FIG. 2 with the exception that the interconnection components 24''' are located on the same side 74 of the interposer substrate as the side on which the semiconductor die 12''' is attached. Printed wiring board assemblies in the configuration illustrated in FIG. 7 can be manufactured in accordance with the description provided above.

Semiconductor dies are typically constructed with interconnection components at the center of the semiconductor die. As discussed above, a redistribution layer can be used to connect the semiconductor die to electrical interconnects on a printed wiring board. Embodiments of printed wiring boards in accordance with the present invention that use various configurations to interconnect semiconductor dies to interposer substrates are illustrated in FIGS. 8A–8C.

Figure 8A:
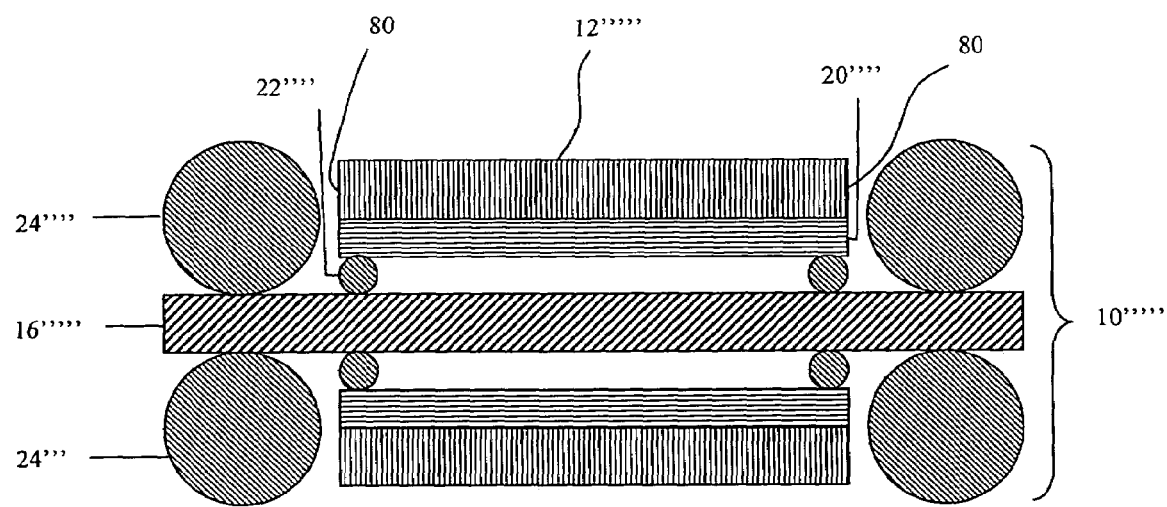
FIGS. 8A–8C show schematic cross-sectional views of various configurations for interconnecting semiconductor dies to interposer substrates in accordance with embodiments of the present invention.
Figure 8B:
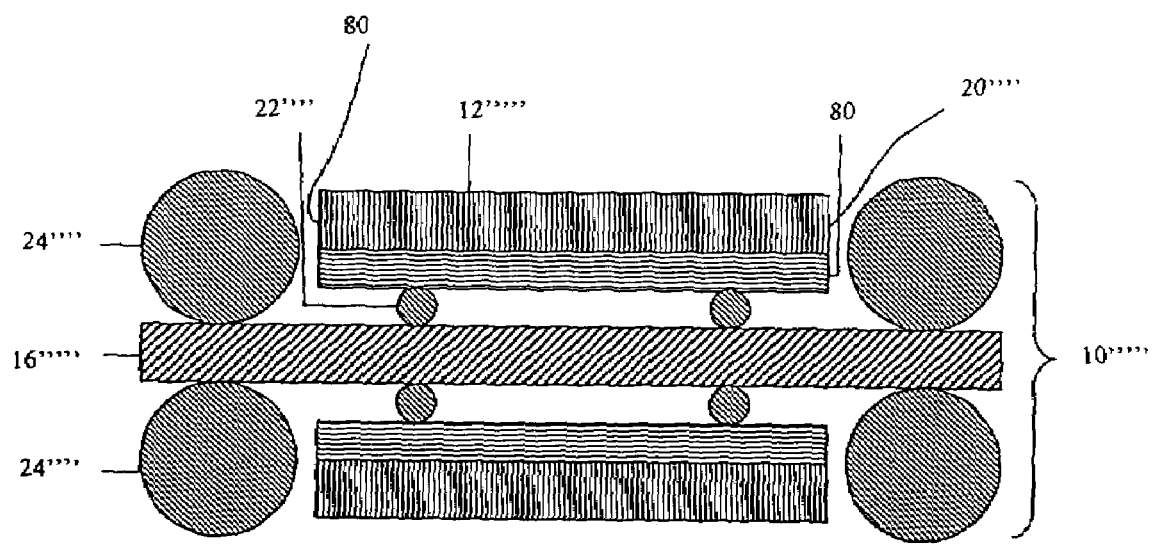

A printed wiring board assembly in accordance with the present invention that includes semiconductor dies attached to two sides of an interposer substrate is illustrated in FIG. 8A. The printed wiring board assembly 10"" includes two semiconductor dies 12"" attached via redistribution layers 20"" and interconnection components 22"" to an interposer substrate 16"". The interposer substrate includes interconnection components 24"" on the same surfaces as the semiconductor dies. The interconnection components that are used to secure the semiconductor dies to the interposer substrate are spaced at the edges 80 of the semiconductor die. By contrast the printed wiring board assembly in accordance with the present invention that is illustrated in FIG. 8B uses interconnection components that are offset a distance from the edges 80 of the semiconductor die.

Figure 8C:
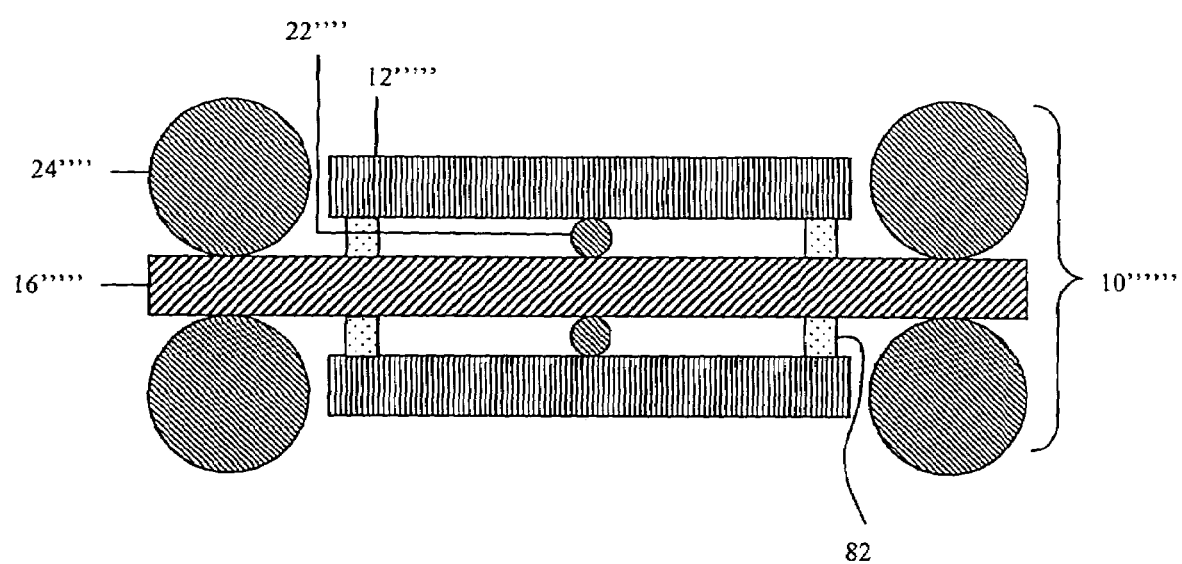

A further embodiment of a printed wiring board assembly in accordance with the present invention is illustrated in FIG. 8C. The illustrated printed wiring board assembly 10""" does not include interfacing layers between the semiconductor dies 12""" and the interposer substrate 16""". Instead, contacts in the central region of the semiconductor die are connected via interconnection components 22"" to the interposer substrate. In circumstances where this configuration is unstable, elastomer pillars 82 can be used to stabilize the die on the interposer substrate. In other embodiments, other materials that provide sufficient support to prevent the semiconductor dies from losing electrical connection with the interposer substrate can be used to stabilize the die on the interposer substrate.

Figure 9:
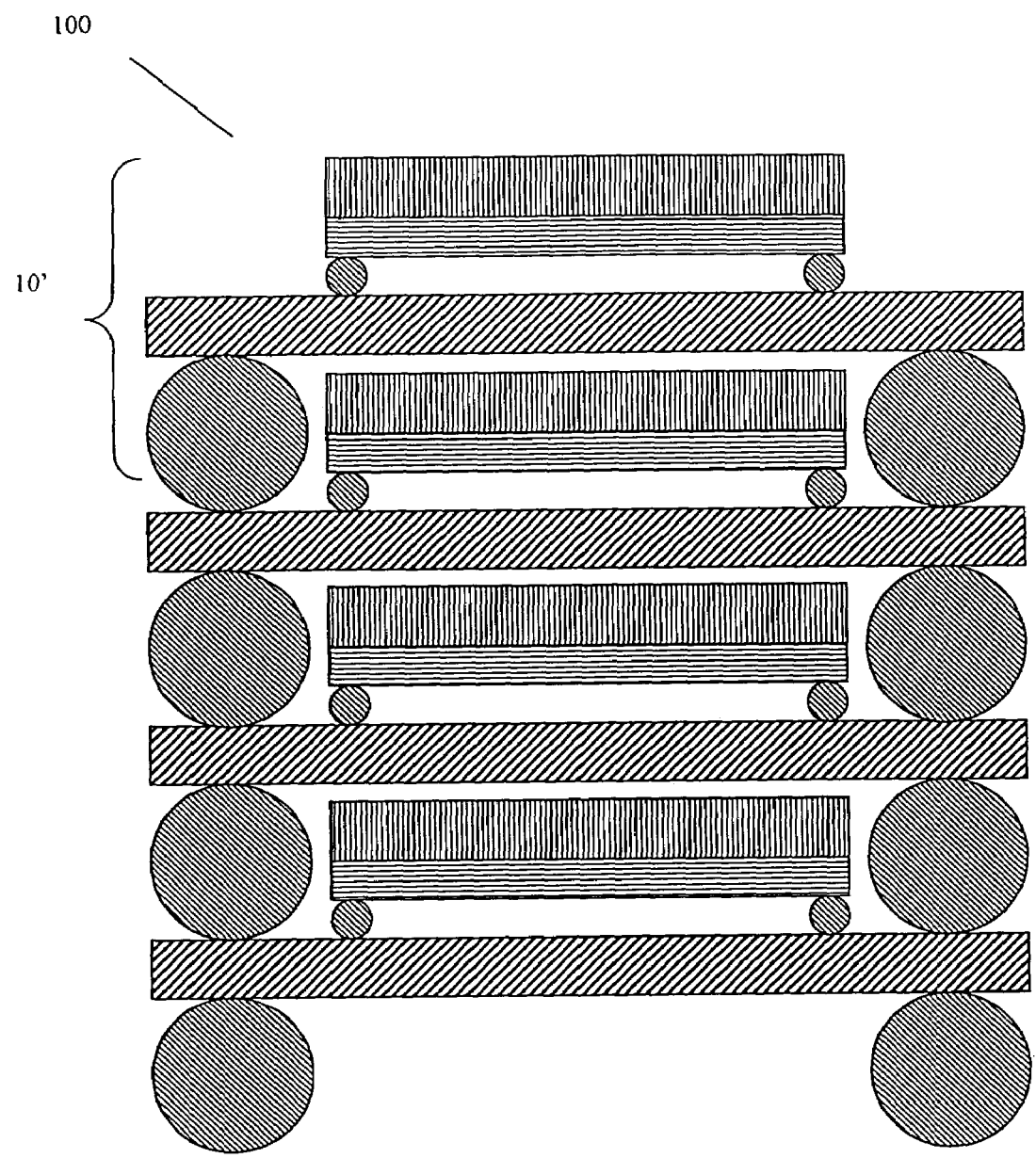
FIG. 9 shows a schematic cross-sectional view of a die stack in accordance with an embodiment of the present invention that is constructed using printed wiring board assemblies similar to the printed wiring board assembly illustrated in FIG. 2.

Many of the structures described above can be layered to create die stacks. A die stack 100 created by stacking printed wiring board assemblies similar to the printed wiring board assembly 10' illustrated in FIG. 2 is shown in FIG. 9. In the illustrated embodiment four printed wiring board assemblies similar to the assembly illustrated as 10' in FIG. 2 are stacked so that the interconnection components of one printed wiring board assembly create an electrical contact with the interposer substrate of a second printed wiring board assembly.

Stacking printed wiring board assemblies can enable multiple semiconductor dies to be mounted in a confined space. In addition, electrical signals can be exchanged between the semiconductor dies within the stack and a single set of interconnection components can be used to exchange electrical signals between any of the semiconductor dies and external devices.

Figure 10:
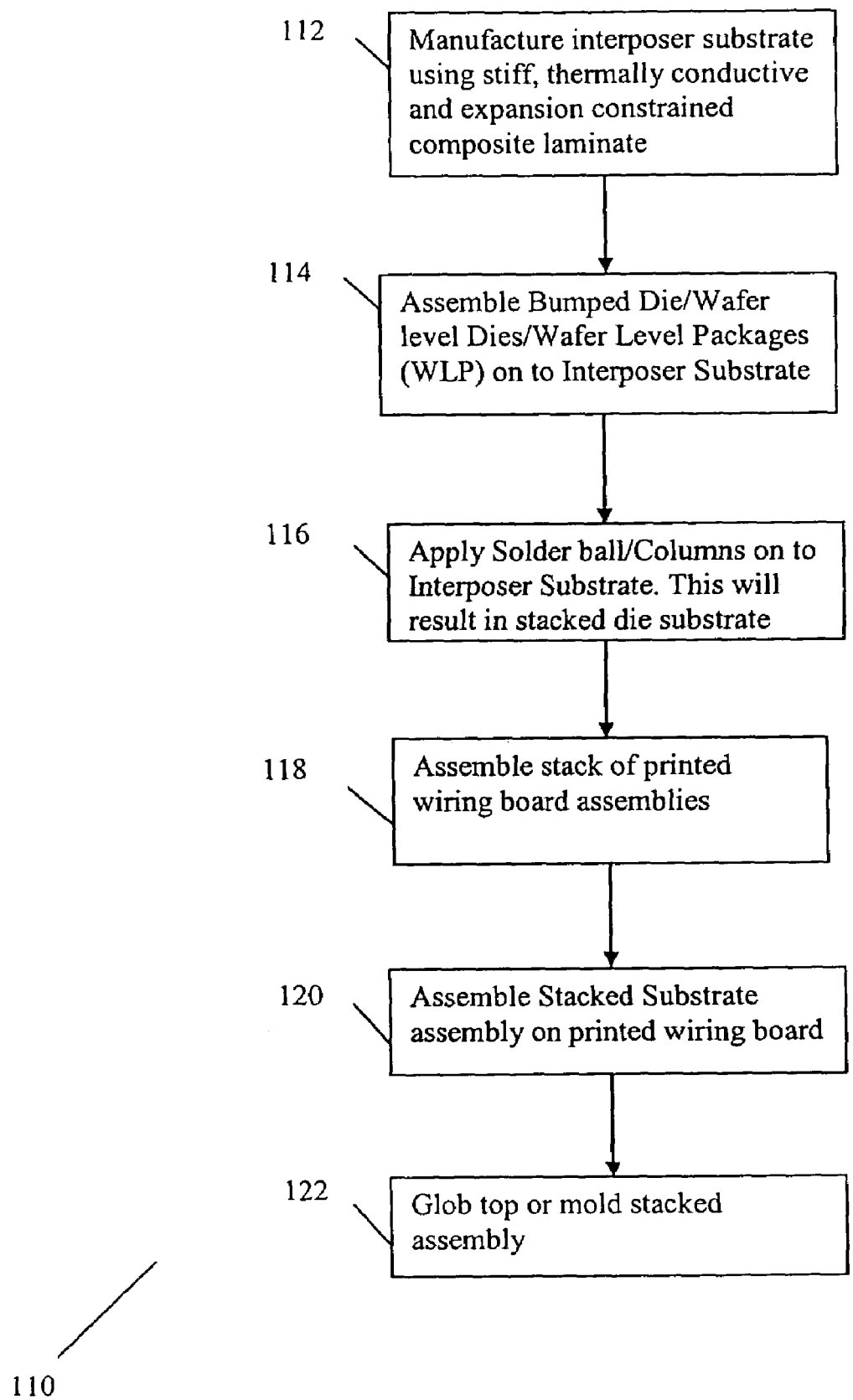
FIG. 10 shows a flow chart illustrating a method of constructing a die stack in accordance with an embodiment of the present invention.

A method in accordance with the present invention for creating a die stack is illustrated in FIG. 10. The method 110 involves manufacturing (112) an interposer substrate, assembling (114) bumped semiconductor dies or Wafer Level dies or Wafer Level Packages (WLP) onto the interposer substrate, applying (116) interconnection components to the interposer substrate to create a printed wiring board assembly in accordance with the present invention, assembling (118) a stack of printed wiring board assemblies to create a die stack and assembling (120) the die stack onto a printed wiring board. Applying a Glob top, a mold, a thermally conductive Glob top or a thermally conductive mold (122) to the die stack assembly if necessary to protect from environment. The manufacturing of the components that are assembled to form a printed wiring board assembly in accordance with the present invention is described above.

Figure 11:
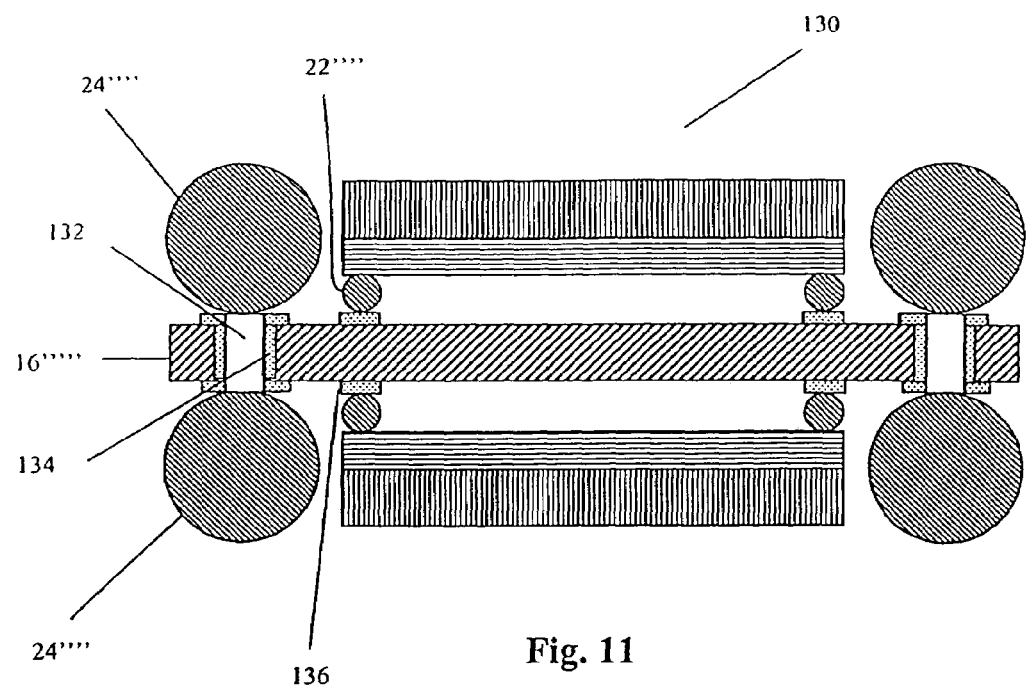
FIG. 11 shows a schematic cross-sectional view of a printed wiring board assembly in accordance with an embodiment of the present invention that uses plated vias to provide electrical connections between interconnection components.

The creation of electrical connections through interposer substrates can facilitate the transfer of electrical signals between semiconductor dies within a die stack and between semiconductor dies within the die stack and external devices. An embodiment, of a printed wiring board assembly that includes plated vias that enable electrical signals to pass between interconnection contacts located upon opposite sides of an interposer substrate in accordance with the present invention is illustrated in FIG. 11. The printed wiring board assembly 130 is similar to the printed wiring board assembly shown as 10""" in FIG. 8A. In the illustrated embodiment, the electrical interconnects 24"" are positioned above plated vias 132 that extend through the interposer substrate 16""". The internal walls of the vias are lined with an electrically conducting material such as copper. In other embodiments, other electrically conducting materials can be used to line the vias. The electrically conducting linings of the vias create a path along which electrical signals can flow between the interconnection components 24''''. The illustrated embodiment also shows the interconnection components 22'''' contacting metal traces 136 on the interposer substrate.

Figure 12:
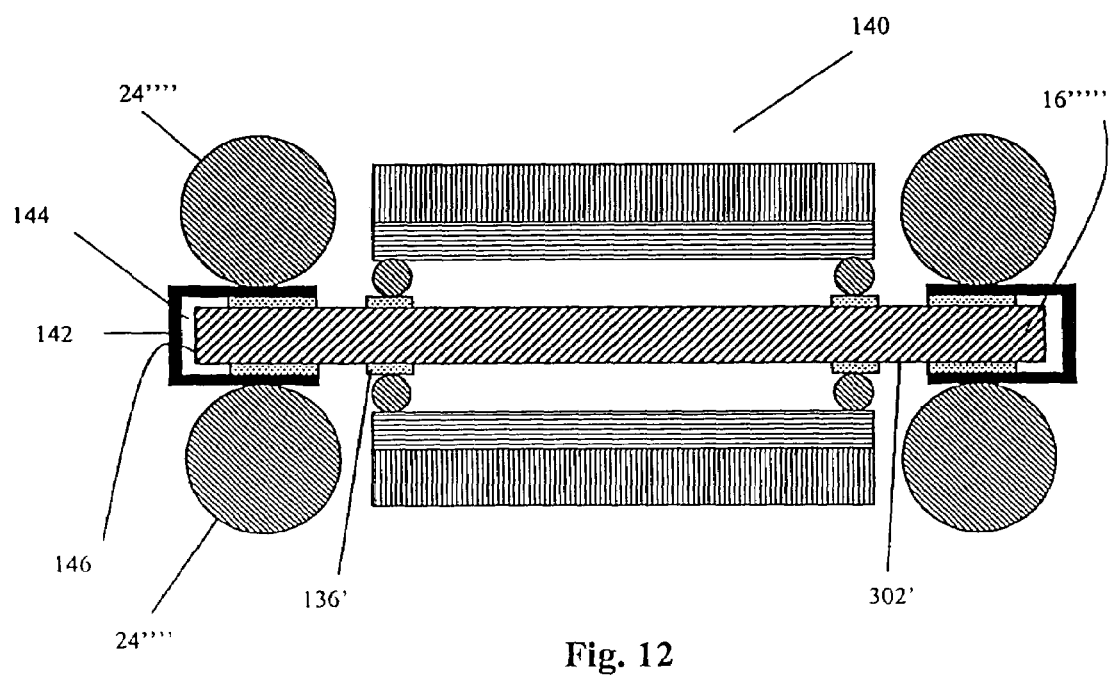
FIG. 12 shows a schematic cross-sectional view of a printed wiring board assembly in accordance with an embodiment of the present invention that uses external connectors to provide electrical connections between interconnection components.

Another technique for creating electrical connections between interconnection components on an interposer substrate in accordance with the present invention is illustrated in FIG. 12. The printed wiring board assembly 140 is similar to the printed wiring board assembly 10'''''' shown in FIG. 8A. The interposer substrate 16'''''' includes a connector 142 that creates a path along which electrical signals can pass between interconnection components on the interposer substrate. Connector 142 can be made from flex or rigid flex printed wiring board.

Figure 13:
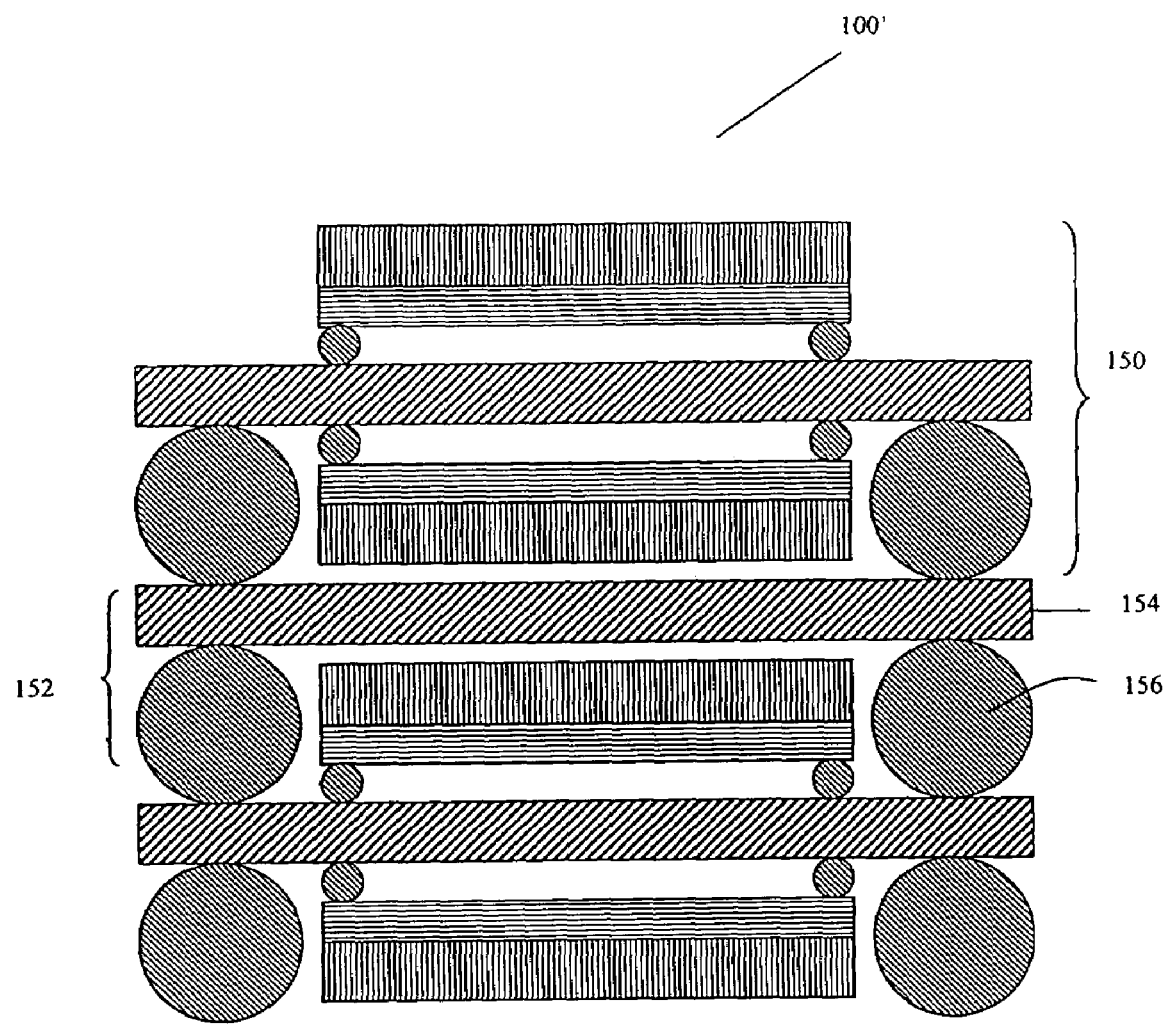
FIG. 13 shows a schematic cross-sectional view of a die stack in accordance with an embodiment of the present invention that is constructed using printed wiring board assemblies similar to the printed wiring board assembly illustrated in FIG. 6 and an intermediate substrate.

A die stack constructed in accordance with the present invention using printed wiring board assemblies similar to the printed wiring board assembly 10'' illustrated in FIG. 6 and an intermediate substrate is shown in FIG. 13. The die stack 100' includes two printed wiring board assemblies 150 similar to the printed wiring board assembly 10'' shown in FIG. 6 and an intermediate substrate 152. The intermediate substrate serves to create a connection between the two printed wiring board assemblies and in one embodiment includes a printed wiring board 154 on which interconnection components 156 are located. Contact between the interconnection components on the printed wiring board assemblies and the intermediate substrate enable electrical signals to pass between the layers in the die stack. The interconnection components used to construct the intermediate substrate can be constructed using the materials and methods described above for constructing an interposer substrate and the interconnection components located on an interposer substrate.

Figure 14:
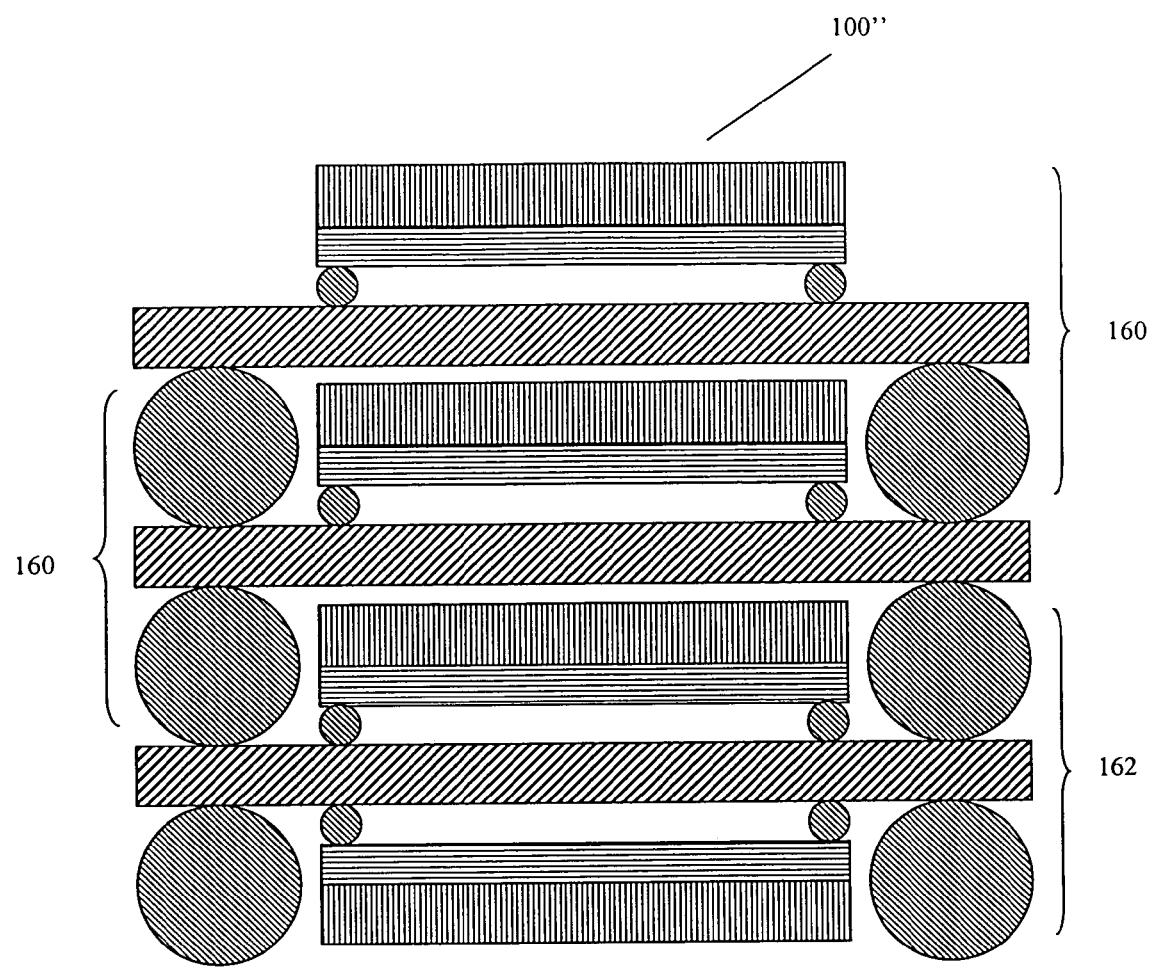
FIG. 14 shows a schematic cross-sectional view of a die stack in accordance with an embodiment of the present invention that is constructed using a combination of printed wiring board assemblies including printed wiring board assemblies similar to the printed wiring board assemblies shown in FIG. 2 and printed wiring board assemblies similar to the printed wiring board assembly shown in FIG. 6.

A die stack constructed in accordance with the present invention using a combination of printed wiring board assemblies is shown in FIG. 14. The die stack 100'' includes two printed wiring board assemblies 160 similar to the printed wiring board assembly 10' shown in FIG. 2 that are layered on top of each other. The bottom layer of the die stack 162 is a printed wiring board assembly similar to the printed wiring board assembly shown as 10'' in FIG. 6.

Figure 15:
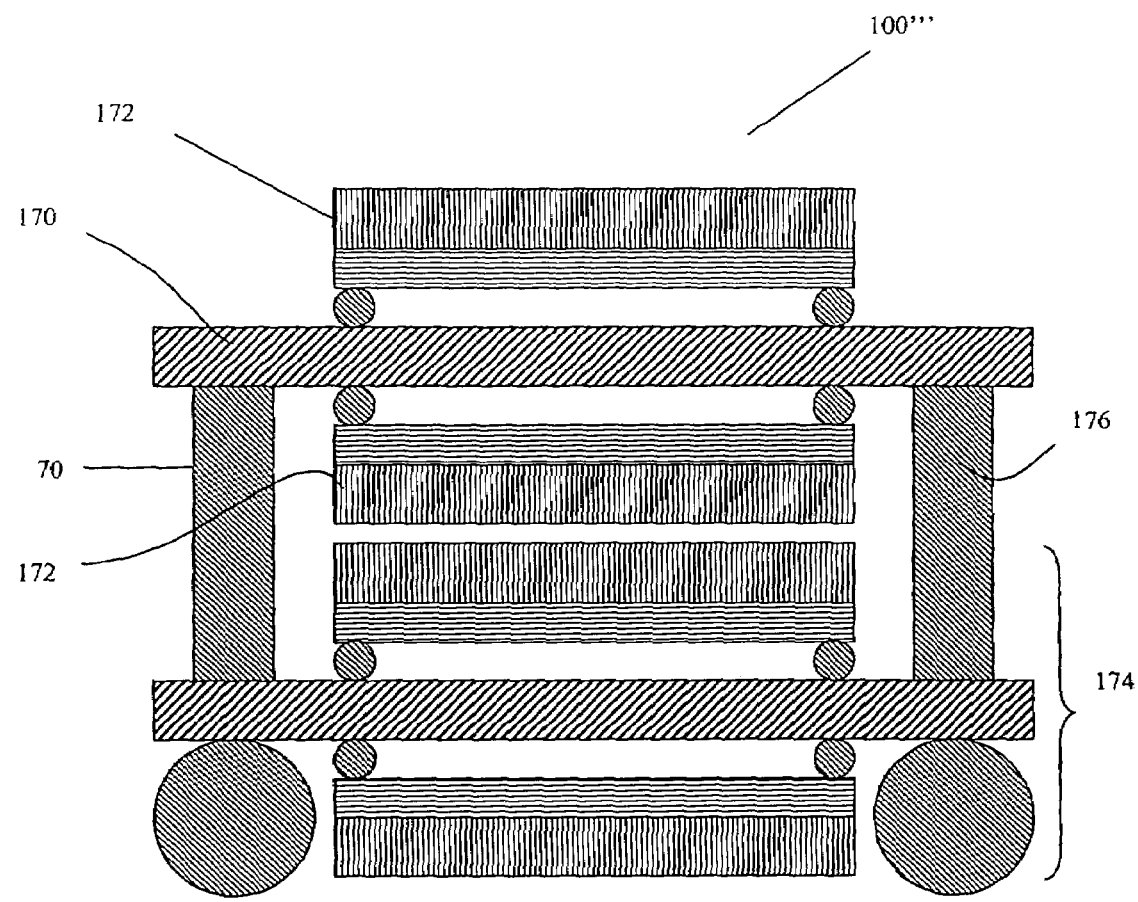
FIG. 15 shows a schematic cross-sectional view of a die stack in accordance with one embodiment of the present invention that uses solder columns as interconnection components.

An alternative die stack structure is illustrated in FIG. 15. The die stack includes a printed wiring board assembly in accordance with the present invention that has an interposer substrate 170 to which two semiconductor dies 172 are attached. The semiconductor dies can be attached on opposite sides of the interposer substrate. The interposer substrate is then connected to a printed wiring board assembly 174 similar to the printed wiring board assembly shown as 10'' in FIG. 6 via solder columns 176. The solder columns are interconnection components that enable electrical signals to pass between the two printed wiring board assemblies.

Figure 16:
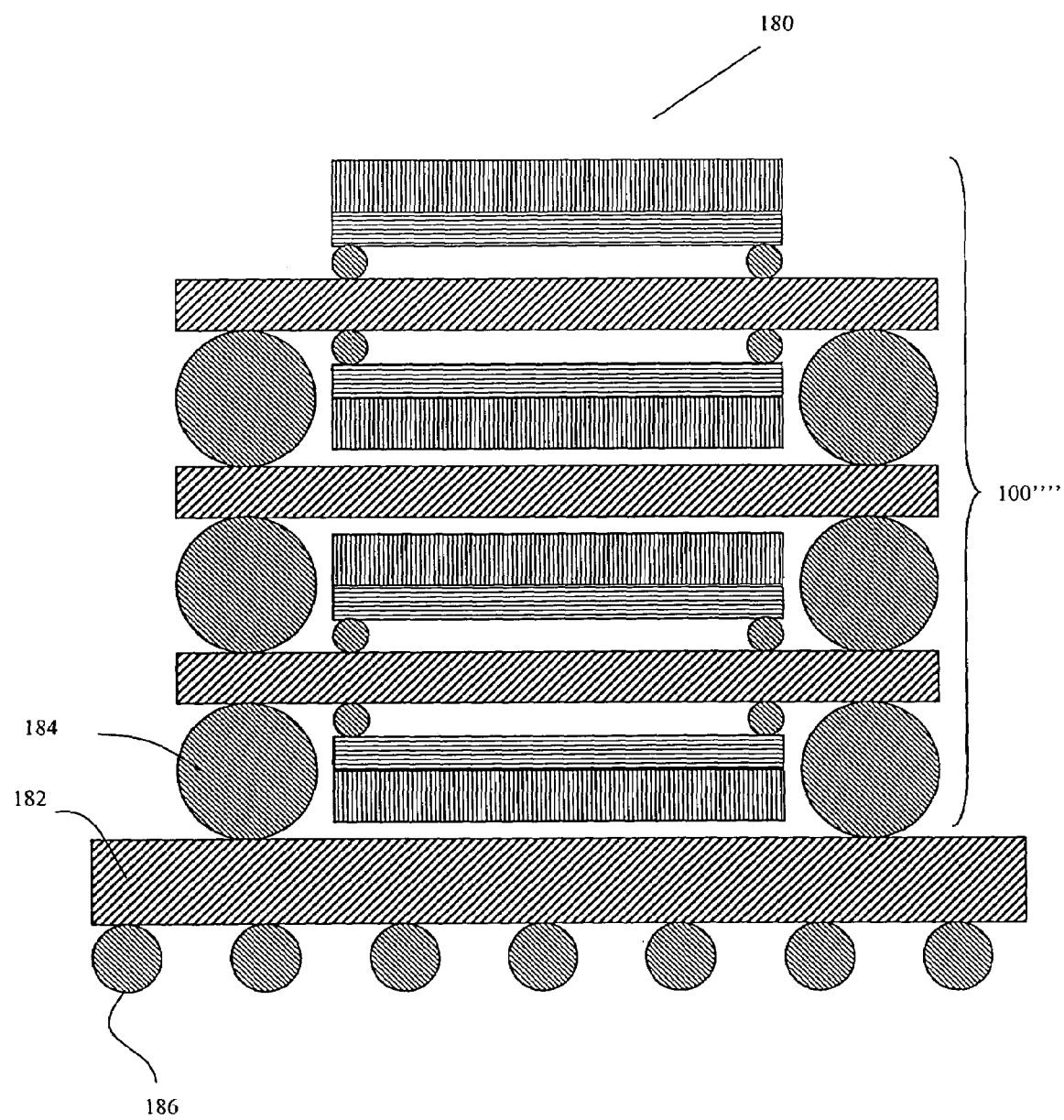
FIG. 16 shows a schematic cross-sectional view of a die stack assembly in accordance with an embodiment of the present invention that includes a die stack, similar to the die stack shown in FIG. 13, connected to a printed wiring board.

A die stack attached to a printed wiring board in accordance with the present invention is illustrated in FIG. 16. The die stack assembly 180 includes a die stack 100'''' similar to the dies stack 100' illustrated in FIG. 13. The dies stack 100'''' is connected to a printed wiring board 182 via the interconnection components 184 on the bottom layer of the die stack. The printed wiring board can be used to communicate electrical signals to the semiconductor dies in the die stack. External devices can utilize the printed wiring board to communicate electrical signals to the semiconductor dies by providing electrical signals to interconnection components 186 on the printed wiring board. The printed wiring board can be manufactured in accordance with the techniques described above or in accordance with any known technique for manufacturing printed wiring boards. In one embodiment, the printed wiring board can include layers containing carbon. In other embodiments, the printed wiring board does not include layers containing carbon.

Figure 17:
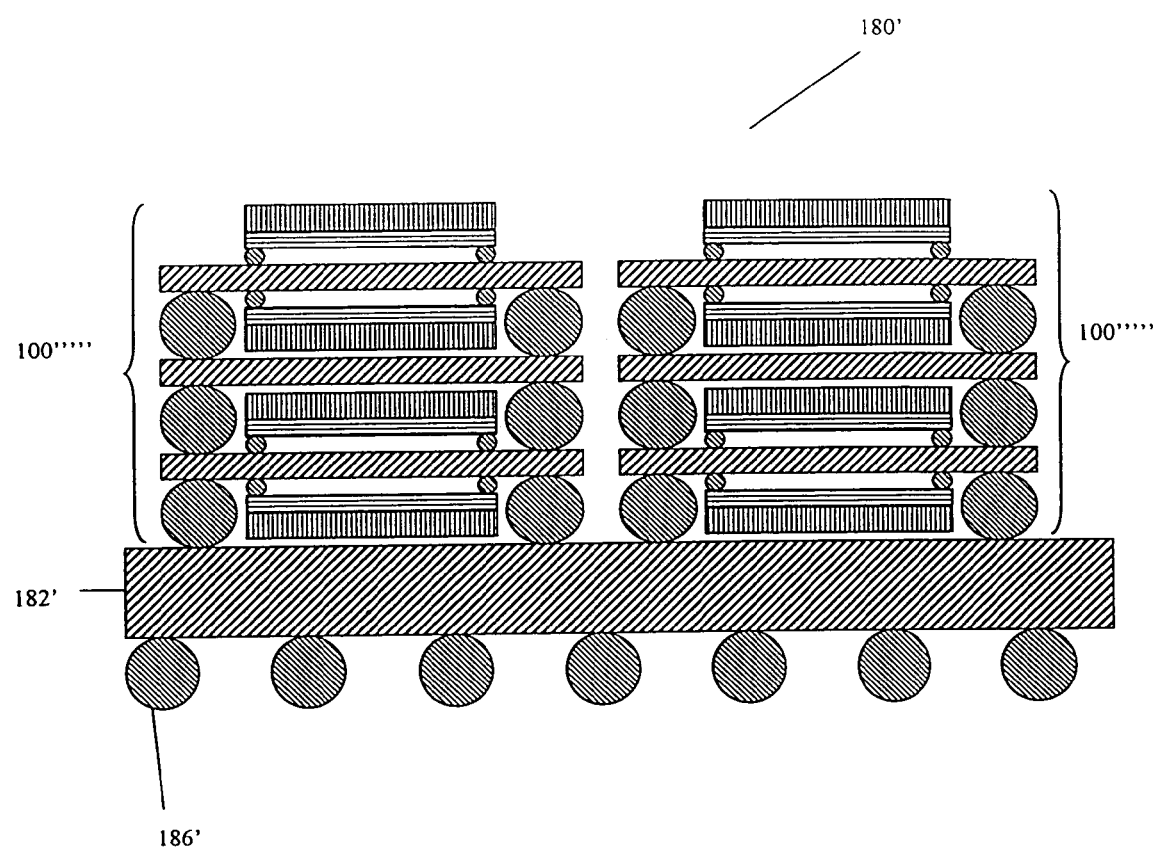
FIG. 17 shows a die stack assembly in accordance with an embodiment of the present invention that includes multiple die stacks connected to a single printed wiring board.

A die stack assembly in accordance with the present invention including multiple die stacks attached to a printed wiring board is illustrated in FIG. 17. This assembly can be considered a Multi-Chip Module with a stacked die configuration. The die stack assembly 180' includes multiple die stacks 100'''' similar to the die stack 100' illustrated in FIG. 13 that are mounted on a printed wiring board 182' via interconnection components 184' on the bottom layer of each die stack. Interconnection components 186' on the printed wiring board 182' can be used to access semiconductor dies in the die stacks.

Figure 18:
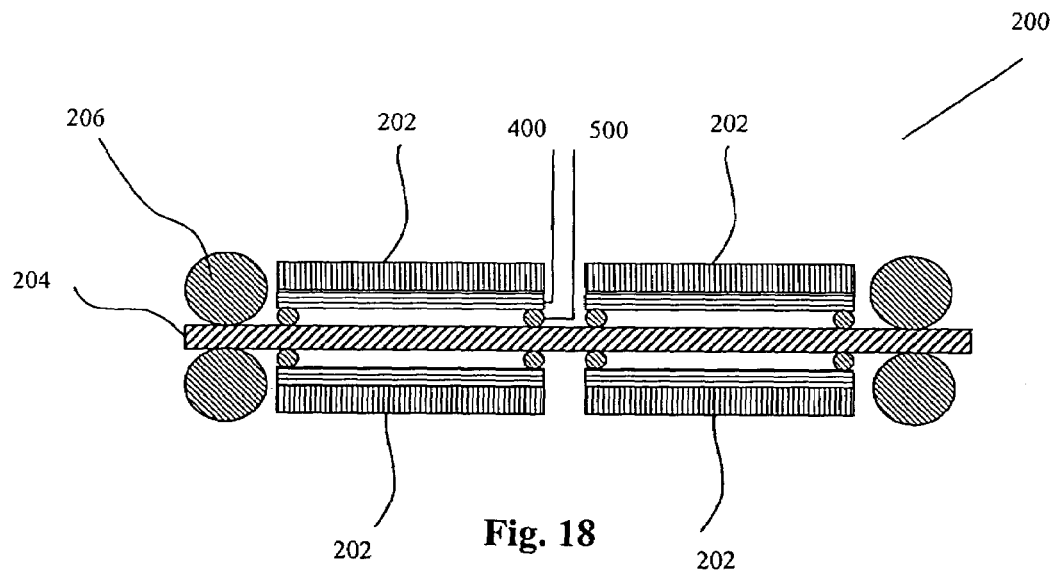
FIG. 18 is a schematic cross-sectional view of a printed wiring board assembly in accordance with an embodiment of the present invention that includes an interposer substrate, which has a surface on which multiple semiconductor dies are mounted.

A printed wiring board assembly in accordance with the present invention that includes multiple semiconductor dies on each side of an interposer substrate is illustrated in FIG. 18. This assembly can also be considered a Multi-Chip Module with a stackable die configuration. The printed wiring board assembly 200 includes multiple semiconductor dies 202 that are arranged on each side of an interposer substrate 204. In one embodiment, the semiconductor dies are arranged side by side in another embodiment the semiconductor dies are arranged to form an array. The semiconductor dies are attached to the interposer substrate in accordance with the techniques described above and the semiconductor dies can be accessed by external devices using interconnection components 206 in a manner similar to the techniques described above.

Figure 19:
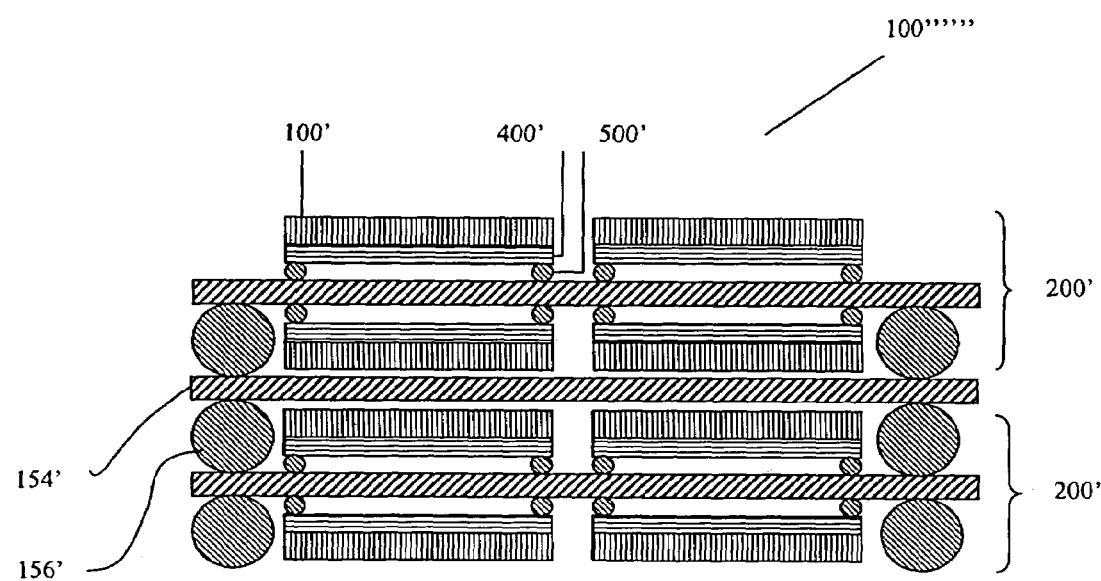
FIG. 19 is a schematic cross-sectional view of a die stack constructed in accordance with an embodiment of the present invention from printed wiring board assemblies similar to the printed wiring board assembly illustrated in FIG. 18 and an intermediate substrate.

A die stack constructed in accordance with the practice of the present invention using printed wiring board assemblies similar to the printed wiring board assembly 200 illustrated in FIG. 18 and an interposer substrate is shown in FIG. 19. This die stack can also be considered a Multi-Chip Module with a stacked die configuration. The die stack 100'''''' includes two printed wiring board assemblies 200' similar to the printed wiring board assembly 200 shown in FIG. 18 that are connected via an intermediate substrate 154'. The intermediate substrate 154' is similar to the intermediate substrate 154 shown in FIG. 13 and serves to provide electrical connections between adjacent layers of the die stack with the assistance of interconnection components 156'.

Any of the printed wiring board assemblies described above can be formed into a die stack. In some embodiments, the formation of die stacks may require the use of intermediate substrates in the manner described above. Once a die stack has been assembled, any die stack can be used to create a die stack assembly in accordance with the present invention by mounting the die stack on a printed wiring board. A die stack assembly in accordance with the present invention need not include a single die stack but can include multiple die stacks having various die stack configurations, which are attached in various locations on the printed wiring board.

Although the foregoing embodiments are disclosed as typical, it would be understood that additional variations, substitutions and modifications can be made to the system, as disclosed, without departing from the scope of the invention. For example, any number of printed wiring board assemblies can be layered to form a die stack and any number of semiconductor dies can be arranged on an interposer substrate side by side, in an array or in any other configuration. In addition, the techniques described above can be used to construct die stacks involving any number of semiconductor dies on each layer in any conceivable configuration and that these layers can be arranged with the assistance of intermediate substrates necessary. Moreover, various interconnection configurations can be used between the printed wiring board assemblies and the intermediate layers including solder balls and/or solder columns. Accordingly, the scope of the invention should be determined not by the embodiments illustrated, but by the appended claims and their equivalents.

What is claimed is:

1. A die stack, comprising:
a stack of printed wiring board assemblies that are connected via interconnection components;
wherein at least one of the printed wiring board assemblies include an interposer substrate having a constraining layer that includes carbon; and
wherein the interposer substrate has a stiffness of more than 3 msi.

2. A die stack, comprising:
a stack of printed wiring board assemblies that are connected via interconnection components;
wherein at least one of the printed wiring board assemblies includes an interposer substrate having a constraining layer that includes carbon;
wherein at least one of the printed wiring board assemblies includes at least one semiconductor die attached to the interposer substrate; and
wherein the semiconductor die is attached to the interposer substrate via a redistribution layer and interconnection components.

3. A die stack, comprising:
a stack of printed wiring board assemblies that are connected via interconnection components;
wherein at least one of the printed wiring board assemblies includes an interposer substrate having a constraining layer that includes carbon;
wherein at least one of the printed wiring board assemblies includes at least one semiconductor die attached to the interposer substrate; and
wherein the semiconductor die is attached to the interposer substrate via interconnection components.

4. A die stack, comprising:
a stack of printed wiring board assemblies that are connected via interconnection components;
wherein at least one of the printed wiring board assemblies includes an interposer substrate having a constraining layer that includes carbon;
wherein at least one of the printed wiring board assemblies includes at least one semiconductor die attached to the interposer substrate; and
wherein multiple semiconductor dies are located on one side of the interposer substrate.

5. A die stack, comprising:
a stack of printed wiring board assemblies that are connected via interconnection components;
wherein at least one of the printed wiring board assemblies includes an interposer substrate having a constraining layer that includes carbon;
wherein at least one of the printed wiring board assemblies includes at least one semiconductor die attached to the interposer substrate; and
wherein multiple semiconductor dies are located on both sides of the interposer substrate.

6. A die stack, comprising:
a stack of printed wiring board assemblies that are connected via interconnection components; and
at least one interposer substrate located between the printed wiring board assemblies in the die stack;
wherein at least one of the printed wiring board assemblies includes an interposer substrate having a constraining layer that includes carbon; and
wherein adjacent printed wiring board assemblies are connected to the interposer substrate via interconnection components.

7. A printed wiring board assembly, comprising:
a semiconductor die;
an electrical connection layer; and
an interposer substrate;
wherein the interposer substrate includes a layer constructed using a carbon material; and
wherein the electrical connection layer includes a redistribution layer and interconnection components.

8. The printed wiring board assembly of claim 7, wherein the redistribution layer is constructed from at least one layer of dielectric film and a thin film solderable layer.

9. A printed wiring board assembly, comprising:
a semiconductor die;
an electrical connection layer;
an interposer substrate; and
additional semiconductor dies connected to the interposer substrate via electrical connection layers;
wherein the interposer substrate includes a layer constructed using a carbon material; and
wherein the electrical connection layer includes a redistribution layer and interconnection components.

10. The printed wiring board assembly of claim 9, wherein at least two semiconductor dies are connected to the same side of the intermediate substrate via electrical connection layers.

11. The printed wiring board assembly of claim 9, wherein at least two semiconductor dies are connected to the opposite sides of the intermediate substrate via electrical connection layers.

12. A die stack assembly, comprising:
a stack of printed wiring board assemblies connected via interconnection components;
a printed wiring board connected to the stack of printed wiring board assemblies via interconnection components;
wherein at least one of the printed wiring board assemblies include an interposer substrate having a constraining layer that includes carbon.

13. A printed wiring board assembly, comprising;
a semiconductor die;
an electrical connection layer; and
an interposer substrate;
wherein the interposer substrate includes a layer constructed using a carbon material;
wherein the electrical connection layer includes a redistribution layer and interconnection components; and
wherein the interposer substrate includes a printed wiring board and interconnection components.

14. The printed wiring board assembly of claim 13 wherein:
the printed wiring board includes at least one electrical layer and at least one constraining layer; and
the constraining layer includes chemical vapor deposition (CVD) diamond.

15. The printed wiring board assembly of claim 13 wherein:
the printed wiring board includes at least one electrical layer and at least one constraining layer; and
the constraining layer includes diamond like carbon.

16. The printed wiring board assembly of claim 13, wherein the printed wiring board includes at least one electrical layer, at least one dielectric layer and at least one constraining layer that is plated on at least one side with a layer of metal.

17. The printed wiring board assembly of claim 13 wherein constraining layer is constructed using a material having a thermal conductivity greater than 15 W/m.K, tensile modulus greater than 20 msi, electrical resistance greater than $10^9$ ohms, a dielectric constant less than 6.0 at 1 MHz and a coefficient of thermal expansion less than 4ppm/° C.

18. The printed wiring board assembly of claim 17, wherein the constraining layer is constructed from a material having a thermal conductivity greater than 100 W/m.K, tensile modulus greater than 50 msi, electrical resistance greater than $10^{10}$ ohms, a dielectric constant less than 5.5 at 1 MHz and a coefficient of thermal expansion less than 3 ppm/° C.

19. The printed wiring board assembly of claim 17, wherein the constraining layer is constructed using a material having a thermal conductivity greater than 500 W/m.K, a tensile modulus greater than 90 msi, an electrical resistance greater than $10^{11}$ ohms, a dielectric constant less than 5.0 at 1 MHz and a coefficient of thermal expansion less than 2 ppm/° C.

20. The printed wiring board assembly of claim 13, wherein the interposer substrate has a coefficient of thermal expansion between −2 ppm/° C. to 12 ppm/° C.

21. The printed wiring board assembly of claim 20, wherein the interposer substrate has a coefficient of thermal expansion of −1 ppm/° C. to 9 ppm/° C.

22. The printed wiring board assembly of claim 20, wherein the interposer substrate has a coefficient of thermal expansion of between 1 ppm/° C. to 6 ppm/° C.

23. The printed wiring board assembly of claim 13, wherein the printed wiring board includes at least one electrical layer, at least one dielectric layer and at least one constraining layer.

24. The printed wiring board assembly of claim 23, wherein the constraining layer is an electrically conductive material.

25. The printed wiring board assembly of claim 24, wherein:
the dielectric layers am interposed between the electrical layers;
the dielectric layers are interposed between the constraining layers;
the dielectric layers are interposed between the electrical layers and the constraining layers.

26. The printed wiring board assembly of claim 24, wherein the constraining layer forms a functional layer within the printed wiring board.

27. The printed wiring board assembly of claim 24, wherein the constraining layer includes resin impregnated Uni tape.

28. The printed wiring board assembly of claim 24, wherein the constraining layer includes resin impregnated compression molded chopped carbon fiber.

29. The printed wiring board assembly of claim 24, wherein the constraining layer is made from a composite of carbon fiber reinforced with main.

30. The printed wiring board assembly of claim 29, wherein the resin used to impregnate the carbon fiber is an epoxy.

31. The printed wiring board assembly of claim 29, wherein the resin used to impregnate the carton fiber is Cynate ester.

32. The printed wiring board assembly of claim 29, wherein the resin used to impregnate the carbon fiber is polyimide.

33. The printed wiring board assembly of claim 29, wherein the resin used to impregnate the carbon fiber is Bismaleimide Triazine epoxy.

34. The printed wiring board assembly of claim 24, wherein the constraining composite layer has a thickness greater than 0.002 inches, in-plane thermal conductivity greater than 1.5 W/m.K, tensile modulus greater than 10 msi, a dielectric constant greater than 6.0 and a coefficient of thermal expansion that is less than 4 ppm/° C. and an electrical resistivity of less than 13 μΩ.m.

35. The printed wiring board assembly of claim 34, wherein the constraining layer has a thickness greater than 0.003 inches, in-plane thermal conductivity greater than 20 W/m.k, tensile modulus greater than 15 msi, a dielectric constant greater than 8.0 and a coefficient of thermal expansion that is less than 3 ppm/° C. and an electrical resistivity of less than 10 μΩ.m.

36. The printed wiring board assembly of claim 34, wherein the constraining layer has a thickness between 0.004 inches and 0.020 inches, an in-plane thermal conductivity greater than 40 W/m.K, a tensile modulus greater than 25 msi, a dielectric constant greater than 12.0, a coefficient of thermal expansion that is less than 2 ppm/° C. and the carbon or graphite that is used in the construction of the constraining layer has an electrical resistivity between 8.5 μΩ.m to 1.1 μΩ.m.

* * * * *